United States Patent
Greco et al.

(10) Patent No.: US 7,453,958 B2
(45) Date of Patent: Nov. 18, 2008

(54) METHOD AND DEVICE FOR EXTRACTING A CLOCK FREQUENCY UNDERLYING A DATA STREAM

(75) Inventors: Patrizia Greco, St. Magdalen (AT); Andreas Steinschaden, Riegersdorf (AT); Edwin Thaller, Faak/See (AT); Gernot Zessar, Kreuth (AT)

(73) Assignee: Infineon Technologies AG (DE)

( * ) Notice: Subject to any disclaimer, the term of this patent is extended or adjusted under 35 U.S.C. 154(b) by 517 days.

(21) Appl. No.: 11/166,657

(22) Filed: Jun. 23, 2005

(65) Prior Publication Data

US 2006/0023824 A1    Feb. 2, 2006

Related U.S. Application Data

(63) Continuation of application No. PCT/EP2003/014814, filed on Dec. 23, 2003.

(30) Foreign Application Priority Data

Dec. 23, 2002   (DE) ............................... 102 60 656

(51) Int. Cl.
    *H04L 27/00* (2006.01)
(52) U.S. Cl. ................... 375/326; 375/220; 375/373; 375/371; 375/376; 331/25; 327/159
(58) Field of Classification Search ................ 375/326, 375/220, 373, 371, 376; 331/25; 327/159
See application file for complete search history.

(56) References Cited

U.S. PATENT DOCUMENTS

| 4,320,391 | A |   | 3/1982  | Mallett |
| 5,487,084 | A |   | 1/1996  | Lindholm |
| 5,818,948 | A |   | 10/1998 | Gulick |
| 5,852,630 | A | * | 12/1998 | Langberg et al. ............ 375/219 |
| 6,061,802 | A |   | 5/2000  | Gulick |
| 6,092,210 | A |   | 7/2000  | Larky et al. |
| 6,125,158 | A |   | 9/2000  | Carson et al. |
| 6,256,362 | B1 | * | 7/2001  | Goldman .................... 375/373 |
| 6,343,364 | B1 |   | 1/2002  | Leydier et al. |
| 6,407,641 | B1 | * | 6/2002  | Williams et al. ............ 331/1 A |
| 6,633,933 | B1 | * | 10/2003 | Smith et al. .................. 710/74 |
| 6,762,635 | B2 |   | 7/2004  | Bruhnke et al. |
| 2001/0011914 | A1 |   | 8/2001  | Pomet |
| 2001/0020857 | A1 |   | 9/2001  | Malherbe et al. |

FOREIGN PATENT DOCUMENTS

| DE | 100 41 772 B2 | 3/2002 |
| EP | 0 414 445 A2  | 2/1991 |
| WO | WO-00/16255 A1 | 3/2000 |

\* cited by examiner

*Primary Examiner*—Shuwang Liu
*Assistant Examiner*—Kabir A Timory
(74) *Attorney, Agent, or Firm*—Dickstein, Shapiro, LLP.

(57) ABSTRACT

A device for extracting a clock frequency underlying a data stream includes means for controlling a controllable oscillator, coarse-tuning means and fine-tuning means, wherein coarse-tuning means responds to a second data pattern present in the data stream and sets the oscillator coarsely based on its length. Fine-tuning means responds to temporally consecutive first data patterns present in the data stream with a higher accuracy in order to perform a fine tuning of the oscillator on the basis of the temporal length between the two first data patterns and on the basis of the number of clock cycles of the controllable oscillator occurring in this temporal length.

42 Claims, 8 Drawing Sheets

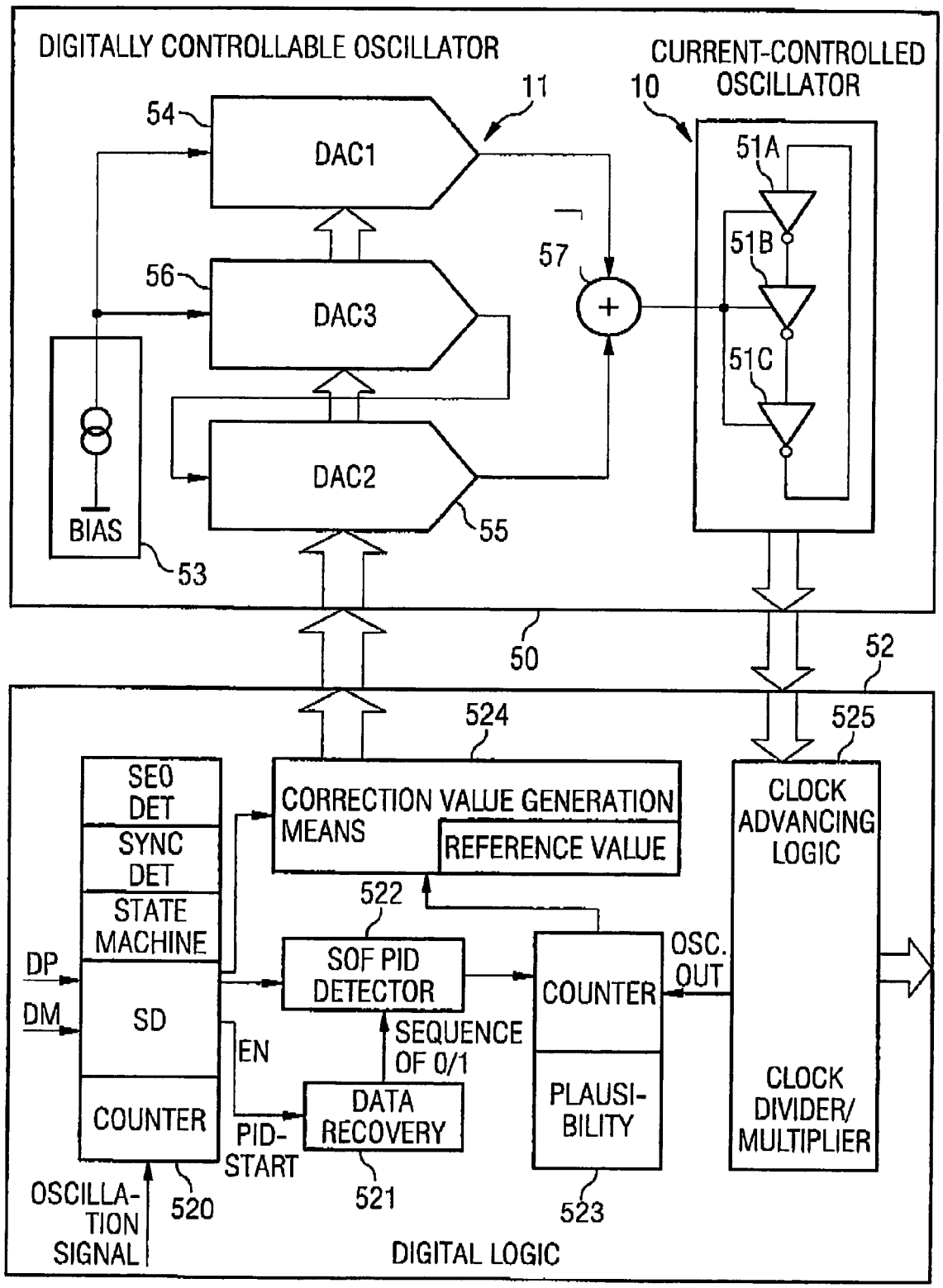

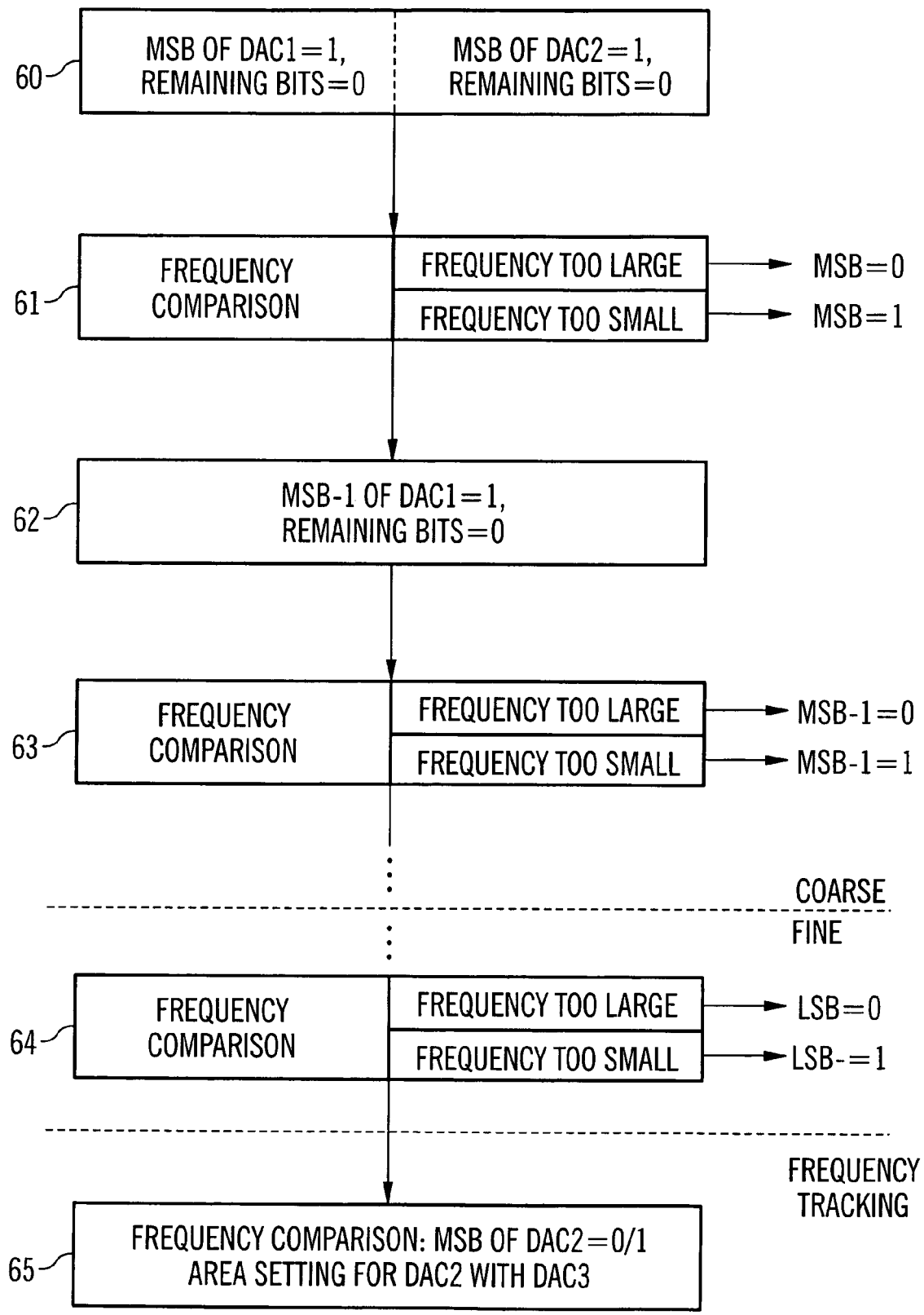

METHOD AND DEVICE FOR EXTRACTING A CLOCK FREQUENCY UNDERLYING A DATA STREAM

CROSS-REFERENCE TO RELATED APPLICATIONS

This application is a continuation of co-pending International Application No. PCT/EP2003/014814, filed Dec. 23, 2003, which designated the United States and was not published in English.

BACKGROUND OF THE INVENTION

1. Field of the Invention

In data transmission technology there is a general need for extracting a clock from a data stream. A data transmission standard which recently spread increasingly is the USB standard (USB=universal serial bus). The USB standard standardizes a data transmission format for a fast data transmission between USB devices and a host. The USB standard defines a so-called tier-star-topology, wherein USB devices may either be hubs or functions or functional devices, respectively. The USB data format is specified in the USB specification. The most current USB definition is currently USB revision 2.0.

2. Description of the Related Art

The USB bus is a semi-duplex bus. All transactions are initiated by the host. In the USB specification revision 2.0 three data transmission rates are defined. The lowest data transmission rate is used in the low-speed mode and comprises 1.5 megabits per second. In the full-speed mode a data transmission rate of 12 megabits per second is used. In the high-speed mode a data transmission rate of 480 megabits per second is used.

The use of the low-speed mode serves for interactive devices, like e.g. a keyboard or a mouse. Only a limited number of low-speed devices should be connected to the bus in order to prevent a degradation of the bus efficiency. For full-speed and high-speed devices a special bandwidth and latency are guaranteed.

Devices are connected to the USB bus via a 4-wire cable, carrying differential data, a power signal and mass. This means, that one core of the 4-wire cables carries a positive differential signal Dp, that a further core of the 4-wire cables carries a negative differential signal Dn and that a further core is on the supply potential and that finally the last core is on the mass potential. The clock information is encoded in the data. According to the USB specification an NRZI encoding and a bit stuffing technology are used in order to guarantee an adequate number of transitions. NRZI means no return to zero invert. This means, that an inverse encoding is used. A logical "1" signal is represented by a non-present change in an electrical signal, while a logical "0" signal is represented by a change of state of the electrical signal. One edge thus represents a zero, while a non-present change, i.e. a steady-state signal, represents a zero. Further, for a steady component reduction a bit stuffing is used, so that after six subsequent ones a positive/negative edge is used.

As it is illustrated in FIG. 7b, the data stream is defined as a series of frames 72, 73, which are separated from each other by so-called control characters 74, wherein the ticks occur at an interval of 1 ms. Within the frame 72 or 73 a plurality of data packets is located. This means that a frame consists of several data packets and that a data stream consists of a plurality of subsequent frames. Each data packet is introduced in the data stream by a packet identification number having a width of 8 bits and illustrated in FIG. 7c. One frame thus includes as many packet identification numbers (PID) as there are packets in the frame. The specification of the packet identification number illustrated in FIG. 7c which is four bits wide and presented in a PID field by the four PID bits $PID_0$, $PID_1$, $PID_2$, $PID_3$ and by the correspondingly inverted PID bits, is determined in the USB standard. The bits represented in FIG. 7c are arranged from the LSb to the MSb. LSb stands for least significant bit, while MSb stands for most significant bit.

The host transmits a start of frame packet (SOF packet) once per millisecond in order to define the ticks 74 represented in FIG. 7b. The SOF packet is represented in FIG. 7d and includes an SYNC field (not illustrated in FIG. 7d), an SOF-PID field 75, an 11-bit frame number (76) and a CRC check sum for the field 76 which is entered into a field 77. The frame number 76 is incremented by 1 with every additional SOF packet.

In FIG. 7a, for example, the synchronization pattern (SYNC pattern) preceding the PID field 75 of FIG. 7d is illustrated as an electric signal. It consists of a sequence of bits specified in the USB standard or of a data pattern, respectively, that looks as illustrated in FIG. 7a as an electric signal due to the NRZI encoding. The sequence of databits is 00000001, which leads to the "electric" sequence 10101011 shown in FIG. 7a. Before the synchronization data pattern an area designated by idle is located comprising with regard to the differential signals Dp and Dm a single-ended zero encoding (SE0 encoding), as it is discussed in the following. This SE0 encoding of the Dp and Dm signals indicates the end of the preceding frame and further indicates that now a new frame follows that is introduced by a synchronization field and is directly followed, as it is shown in FIG. 7a, by the packet identification number and in particular, as it is shown in FIG. 7c, a least significant bit of the PID and the next high-order bit of the PID, etc.

The notation shown in FIG. 7a illustrates that the bits are fixed in the synchronization pattern and that the associated electric signal can have the sequence of 10101011, while the PID bits may have both a 0 or a 1, depending on the packet identification to be encoded.

Every low-speed or full-speed data packet transmitted via the USB bus thus starts with a synchronization pattern (FIG. 7a) followed by the packet identification number (PID), as illustrated in FIG. 7c, which defines the packet type. The synchronization field includes a series of 0-1 transitions on the bus in order to enable a receiver to synchronize onto the bit clock.

As it is illustrated in FIG. 7, a frame interval of one millisecond is defined. The host transmits an SOF packet (start of frame packet) once per millisecond (FIG. 7b). The SOF packet consists of a synchronization field followed by the SOF-PID, an 11-bit frame number and a CRC 5-finger print (FIG. 7d). The frame number is incremented with every SOF packet sent.

When a device is connected to the USB bus, a startup sequence takes place. At the end of this sequence the device is driven into a reset state. After the reset event the device has a time period of 10 milliseconds in order to perform a reset recovery. During this time the device receives SOF packets.

A conventional USB device is schematically illustrated in FIG. 9. It includes an analog USB front end that may be integrated with a differential transmitter (TX) and a differential receiver (RX) in a functional unit 90. At one side of the element 90 the signals Dp and Dm are present in analog form, while at another side of the element 90 the corresponding received and analog/digital-converted signals are applied that are fed into a USB core 91 or are received from the same, respectively. These signals are illustrated in FIG. 9 by the two pairs of parallel signal arrows. The USB device further includes a crystal oscillator 92 connected to a crystal oscillator wiring 93, wherein the crystal oscillator wiring 93 on the one hand controls the USB core 91 and on the other hand a clock distribution 94 connected to a CPU 95 which is again in operational connection with a memory 96. Further, a USB device, depending on the application, also includes a parallel input/output interface (parallel I/O) 97.

Such conventional USB devices typically use a crystal oscillator 92 as a clock source for the system devices and the USB data recovery circuit, as it may be seen from FIG. 9. For robust portable devices, like e.g. chip cards, it would be desirable that they extract their own local clock directly from the USB data stream. For such devices the use of crystal oscillators is impractical, as crystals may usually not be integrated into a chip and are further very prone to damage due to mechanical loads. Chip cards are usually carried in rough environments, like e.g. in a purse carried in a trouser pocket. The thus exerted mechanical load would be fatal for a quartz crystal oscillator.

Thus, clock generation circuits for USB devices which were developed in the low-speed mode do not require crystal oscillators.

US 2001/0011914 A1 discloses a device for the recovery of a clock signal from at least two synchronization bits. As a reference clock signal a signal of an internal oscillator is used in order to measure the number of reference clock pulses between the first two synchronization pulses sent from one external USB bus at the beginning of each transaction. Thus, a coarse measurement N for the USB clock signal is obtained which is to be regenerated. The delay of each of these two synchronization pulses with regard to the preceding pulse of the reference clock signal is measured. This delay is calculated with regard to an internally defined time unit. On the basis of the measurement of these two delays and the measurement of a number of reference clock periods.

US 2001/0020857 A1 discloses a device for the regeneration of a clock signal from an external serial bus, wherein the device comprises a ring oscillator and a counter. The ring oscillator provides n phases of a clock signal. Of those n phases one phase is used as a reference and applied to the counter. It is thus possible to count the number of overall reference clock signal periods between a first pulse and a second pulse which are obtained from the bus. When reading the state of the phases in the oscillator when receiving the second pulse a current phase is determined corresponding to the phase shift between the reference clock signal and the second pulse of the bus. Using a regeneration device also including a ring oscillator and a counter, it is possible to regenerate the clock signal on the bus with a high accuracy.

The U.S. Pat. No. 6,343,364 B1 discloses a method and a device for a local clock generation using the USB signals Dp and Dm operating without a quartz crystal oscillator or a resonator. For this, a number of cycles of a free-running high-frequency clock signal are counted occurring in a known number of bit periods of the received signal. Hereupon, the counted number of cycles of the free-running high-frequency signal is separated by the known number of bit periods in order to determine a resulting number of clock cycles contained in a single bit duration of the received USB signal. Based on this, a local clock signal is generated.

WO 00/16255 discloses a method for data transmission and a smart card suitable for this. The signals Dp and Dm are connected to an interface of the card. The card further includes a CPU, memory units, USB output contacts and an arrangement of at least six contact faces level with the surface of the card body.

The U.S. Pat. No. 5,487,084 discloses a concept for generating a clock frequency in a smart card interface used for a data transmission from a smart card for example to a mobile telephone in order to obtain a predetermined data rate. A phase-locked loop and a number of programmable counters are used in order to obtain a clock signal with a frequency which is a multiple of the data rate. In particular, the counters and the phase-locked loop may be selected so that the frequency is the 16-fold of such a data rate to be able to use a universal asynchronous receiver/transmitter (UART).

The U.S. Pat. No. 5,818,948 discloses an architecture for a USB-based PC loudspeaker control device. For recovering a clock from the received data stream a phase-locked loop is used.

The U.S. Pat. No. 6,061,802 discloses a software-based clock synchronization with an isochronous master clock structure in which the frame rate clocks of a plurality of data busses are synchronized onto a master clock signal. The master clock signal is derived from the existing clock signals within the computer system or from data received from an external source.

The U.S. Pat. No. 6,092,210 discloses a device and a method for synchronizing the clocks of connected USB busses by synchronizing clocks in a local device to the data streams of both USB busses. For this, a separate local clock synchronization device for each USB device is used connected to the regarded USB device. Every separated local clock synchronization may use the same reference clock.

DE 10041772 C2 discloses a clock generator, in particular for USB devices, wherein due to a synchronization signal periodically returning in the data stream a pulse filter is controlled in order to reduce a frequency of a pulse train output by an internal block generator by suppressing pulses in the effective frequency. Further, using the synchronization signal and a value stored in a pulse number storage or using an output signal of a data signal decoder, respectively, a frequency generated by the internal clock generator is re-tuned.

Conventional clock recovery systems, as they are presented in the above-described references, use the synchronization pattern (FIG. 7a) preceding every USB data packet. This may be sufficient for low-speed USB applications with regard to accuracy. For faster applications in the USB full-speed mode or the USB high-speed mode the accuracy of the synchronization pattern is too low. This is illustrated with regard to the following numerical examples. There is a requirement for full-speed USB devices in so far that the transmission clock must be accurate to 0.25% (2500 ppm). Due to the large time jitter which is at 12 ns for paired transitions or at 20 ns for consecutive transitions, respectively, admitted for the serial bit data on the USB bus, a reliable clock recovery merely based on the synchronization pattern is not possible.

SUMMARY OF THE INVENTION

It is an object of the present invention to provide on the one hand an economic and on the other hand an accurate concept for extracting a clock frequency underlying a data stream.

In accordance with a first aspect, the present invention provides a device for extracting a clock frequency underlying a data stream, wherein the data stream comprises a first data pattern (SOF-PID) at regular first temporal intervals specified with a relative first accuracy, and wherein the data stream further comprises a second data pattern (SYNC field) comprising a plurality of clock periods with the clock frequency or a multiple of the clock frequency, wherein the clock periods are specified with a second relative accuracy smaller than the first relative accuracy, having a controller for controlling a controllable oscillator for providing an oscillator clock with an oscillator clock frequency, wherein the controller for controlling comprises both a first digital/analog converter and a second digital/analog converter and a summer, coupled to the outputs of the first digital/analog converter and the second digital/analog converter and implemented in order to provide a control signal for the controllable oscillator; a coarse-tuner implemented in order to control the controller for controlling the oscillator using the second data pattern and a number of clock periods of the oscillator in order to reduce its oscillator clock frequency or to increase the oscillator clock frequency; and a fine-tuner operable after the coarse-tuner was operable and implemented in order to control the controller for controlling the oscillator using a first data pattern and a temporally subsequent first data pattern and a number of clock periods of the oscillator between the first data pattern and the temporally subsequent first data pattern in order to reduce its oscillator clock frequency or to increase its oscillator clock frequency, whereby an oscillator clock frequency is obtained with the relative second accuracy which is equal to the clock frequency underlying the data stream or equal to a multiple or a fraction of the clock frequency underlying the data stream, wherein the coarse-tuner and the fine-tuner are operable in order to set bits of the first digital/analog converter; a frequency-tracker which is implemented in order to be operable after a coarse tuning by the coarse-tuner and after a fine tuning by the fine-tuner in order to set bits of the second digital/analog converter.

In accordance with a second aspect, the present invention provides a method for extracting a clock frequency underlying a data stream, wherein the data stream comprises a first data pattern, (SOF-PID) in regular first temporal intervals specified with a relative first accuracy, and wherein the data stream further comprises a second data pattern (SYNC field) comprising a plurality of clock periods with the clock frequency or a multiple of the clock frequency, wherein the clock periods are specified with a second relative accuracy which is smaller than the first relative accuracy, with the steps of controlling a controllable oscillator for providing an oscillator clock with an oscillator clock frequency using a coarse-tuning step, a fine-tuning step and a frequency-tracking step, wherein controlling is performed by means of a first digital/analog converter and a second digital/analog converter and a summer coupled to the outputs of the first digital/analog converter and the second digital/analog converter and is implemented to provide a control signal for the controllable oscillator, wherein in the coarse-tuning step using the second data pattern and a number of clock periods of the oscillator the oscillator clock frequency is decreased or increased; and wherein in the fine-tuning step following the coarse-tuning step using a first data pattern and a temporally subsequent first data pattern and a number of clock periods of the oscillator between the first data pattern and the temporally subsequent first data pattern the oscillator clock frequency is decreased or increased, whereby an oscillator clock frequency with the relative second accuracy is obtained which is equal to the clock frequency underlying the data stream or to a multiple or a fraction of the clock frequency underlying the data stream, whereby the coarse-tuning step and the fine-tuning step bits of the first digital/analog converter are set, and wherein the frequency-tracking step is performed after the coarse-tuning step and after the fine-tuning step, and wherein in the frequency-tracking step bits of the second digital/analog converter are set.

In accordance with a third aspect, the present invention provides a device for extracting a clock frequency underlying a data stream, wherein the data stream comprises a first data pattern in regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy smaller than the first relative accuracy, having a controller for controlling a controllable oscillator for providing an oscillator clock with an oscillator clock frequency; a coarse-tuner implemented to control means for controlling the oscillator in order to decrease its oscillator clock frequency or in order to increase the oscillator clock frequency, using the second data pattern and a number of clock periods of the oscillator; and a fine-tuner which is operable after the coarse-tuner was operable and which is implemented to control the controller for controlling the oscillator in order to decrease its oscillator clock frequency or to increase its oscillator clock frequency, using a first data pattern and a temporally subsequent first data pattern and a number of clock periods of the oscillator between the first data pattern and the temporally subsequent first data pattern, whereby an oscillator clock frequency with the relative second accuracy is obtained equal to the clock frequency underlying the data stream or equal to a multiple or a fraction of the clock frequency underlying the data stream, wherein the oscillator control comprises a digital/analog converter, wherein the digital/analog converter may be pulsed with a binary number of a width of n bits on the input side, wherein a control quantity supplied by the digital/analog converter on the output side may be supplied to the controllable oscillator, wherein the coarse-tuner is implemented in order to determine, iteratively and based on a most significant bit, a predetermined number of low-order bits following the most significant bit, wherein the predetermined number is smaller than n, and wherein the fine-tuner is implemented in order to determine, iteratively and based on a bit whose order is smaller than a least significant bit determined by the coarse-tuning means, remaining bits of the digital/analog converter.

In accordance with a fourth aspect, the present invention provides a method for extracting a clock frequency underlying a data stream, wherein the data stream comprises a first data pattern, (SOF-PID) in regular first temporal intervals specified with a relative first accuracy, and wherein the data stream further comprises a second data pattern (SYNC field) comprising a plurality of clock periods with the clock frequency or a multiple of the clock frequency, wherein the clock periods are specified with a second relative accuracy which is smaller than the first relative accuracy, having the steps of controlling a controllable oscillator for providing an oscillator clock with an oscillator clock frequency using a coarse-tuning step and a fine-tuning step, wherein the coarse-tuning step is implemented to decrease or increase the oscillator clock frequency using the second data pattern and a number of clock periods of the oscillator; and wherein the fine-tuning step following the coarse-tuning step is implemented in order to decrease or increase the oscillator clock frequency using a first data pattern and a temporally subsequent first data pattern and a number of clock periods of the oscillator between the first data pattern and the temporally subsequent first data pattern, whereby an oscillator clock frequency with the relative second accuracy is obtained which is equal to the clock frequency underlying the data stream or equal to a multiple or to a fraction of the clock frequency underlying the data stream, wherein for an oscillator control a digital/analog converter is present, wherein the digital/analog converter may be pulsed on the input side with a binary number of a width of n bits, wherein a control quantity provided by the digital/analog converter on the output side may be supplied to the controllable oscillator, wherein in the coarse-tuning step, iteratively and based on a most significant bit, a predetermined number of low-order bits following the most significant bits is determined, wherein the predetermined number is smaller than n, and wherein in the fine-tuning step, iteratively and based on a bit whose order is smaller than a least significant bit determined by the coarse-tuning means, remaining bits of the digital/analog converter are determined.

In accordance with a fifth aspect, the present invention provides a computer program having a program code for performing the above-mentioned method for extracting, when the computer program runs on a computer.

BRIEF DESCRIPTION OF THE DRAWINGS

Preferred embodiments of the present invention are explained in more detail in the following with reference to the accompanying drawings, in which:

FIG. 5 shows a block diagram of an inventive device for extracting according to a preferred embodiment of the present invention;

FIG. 6 shows a flowchart for explaining the iteration method used in the embodiment illustrated in FIG. 5;

DESCRIPTION OF THE PREFERRED EMBODIMENTS

Figure 1:
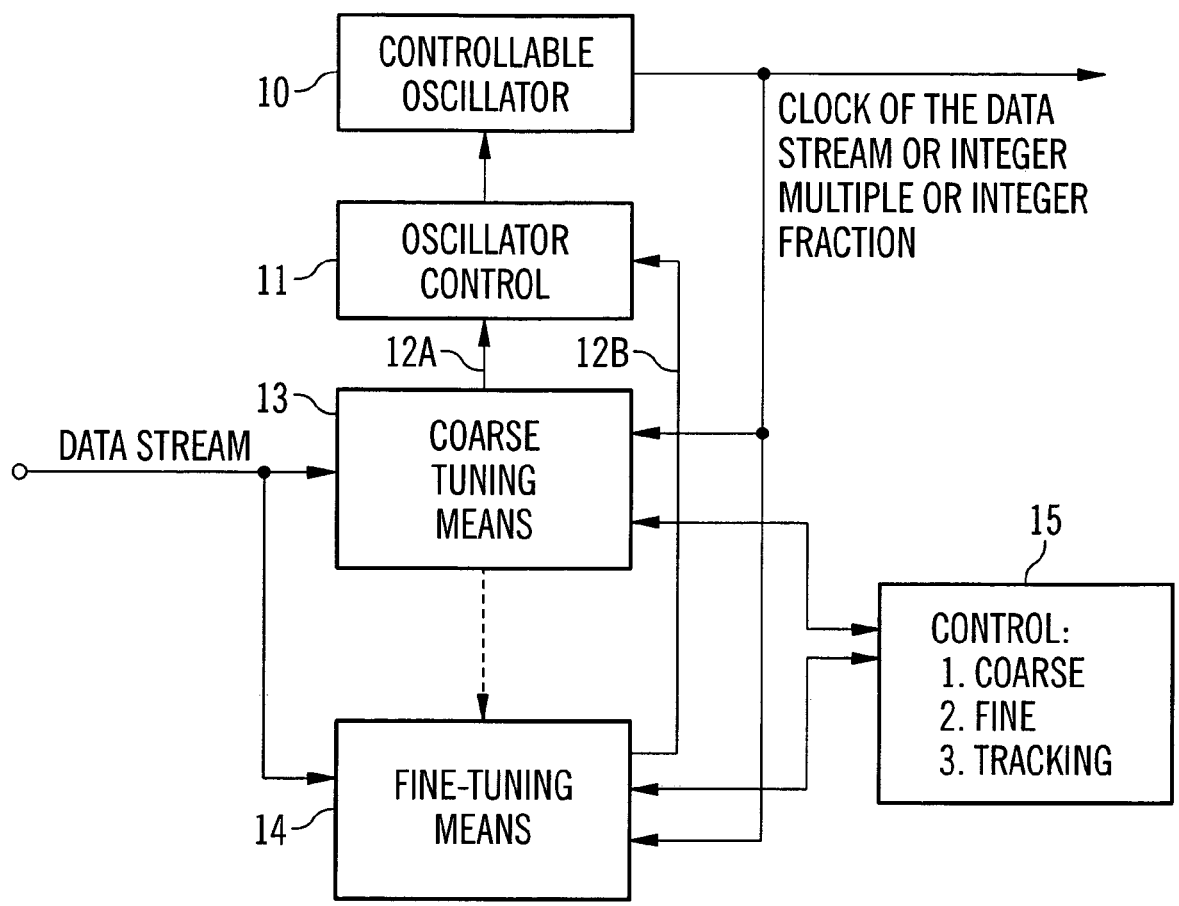
FIG. 1 shows a block diagram of an inventive device for extracting a clock frequency underlying a data stream.

The present invention is based on the finding that also for faster USB modes the synchronization field alone or the time duration of the synchronization field, respectively, is at least sufficient in order to achieve a coarse setting of an oscillator which is restrictedly free-running. The thus obtainable accuracy for the setting of the free-running oscillator is much too low, however, in order to perform a sensitive data extraction. It is, however, already sufficiently accurate in order to start with a coarse data recovery in order to decode the packet identification field following the synchronization field. According to the invention, the number of clock periods of the free-running oscillator is counted between two temporally consecutive packet identification fields and compared to a predetermined reference value.

The present invention is therefore based on the fact that although a time jitter is admitted for consecutive USB clocks of 12 ns or 20 ns, respectively, the accuracy for a frame interval, i.e. for the interval between two consecutive start of frame packet identifications in percent, is preset substantially tighter. Thus, in the USB standard a frame interval is defined to be 1 ms ±500 ns. This corresponds to a relative accuracy of 0.05%. According to the invention, consequently the frame period present with a high relative accuracy is used in order to obtain a fine tuning of the clock recovery oscillator.

At this point it is to be noted that the fine tuning on the basis of the frame period, i.e. the first data pattern in a preferred embodiment, is only performed after the coarse tuning on the basis of the synchronization field, as in the preferred embodiment a frame identification number decoding functions well after a coarse tuning took place.

The inventive concept is advantageous in so far that a two-step proceeding is used in which the fine tuning is based on the coarse tuning and thus enables a clock recovery also for devices operating with fast data rates, like e.g. the USB high-speed mode or the USB full-speed mode, without external quartz oscillators or expensive non-integratable resonators.

The inventive concept is further advantageous in so far that the use of simple and thus robustly operating algorithms is possible so that a simple and simultaneously robust implementation, e.g. on portable devices like chip cards, etc. is possible, which are also limited with regard to the computational power and with regard to the storage requirement per se.

According to the invention, thus on the basis of a second data pattern present in the data stream that is preferably easily detectable a coarse tuning is performed, and on the basis of the first data patterns recurring in the data stream a fine tuning is performed, wherein the recurring first data patterns are present with a high accuracy, are, however, not so easily detectable as a second data pattern. Thus, a clock recovery is obtained with the high accuracy underlying the recurring first data pattern in the data stream, for the detection of which, however, a coarse tuning of the oscillator is used on the basis of the easily detectable, however inaccurately present second data pattern.

The inventive two-step concept enables obtaining on the one hand fast and on the other hand accurate frequency setting. For USB applications only one startup time of about 10 ms exists in which a new communication subscriber has to be ready. If the subscriber is not ready within this time, an, error signal results. Only based on the fine tuning this time is usually not sufficient as there are only 10 consecutive SOF-PIDs in the startup time of 10 ms.

On the other hand, the coarse tuning alone is fast, but too inaccurate, as the synchronization pattern is too inaccurate in the data stream.

According to the invention, thus the coarse tuning is for example performed with the first synchronization pattern, so that in the startup time of 10 ms enough consecutive events remain in the data stream (e.g. SOF-PIDs) so that a secure and accurate tuning of the now coarsely tuned oscillator is achieved.

FIG. 1 shows a device for extracting a clock frequency underlying a data stream, wherein the data stream comprises a first data pattern, like e.g. a start of frame packet identification number (SOF-PID), at regular first temporal intervals specified with a relative first accuracy, like e.g. 1 ms in an application for a USB data stream, and wherein the data stream further comprises a second data pattern (synchronization field) comprising a plurality of clock periods according to the clock frequency or a multiple of the clock frequency, wherein the clock periods are specified with a second relative accuracy Which is smaller than the first relative accuracy.

The inventive device is implemented in order to control a controllable oscillator 10, i.e. in order to provide an oscillator controller 11 with coarse-tuning signals on a line 12a or fine-tuning signals on a line 12b such that the oscillator controller 11 may feed a corresponding voltage signal to the controllable oscillator 10 depending on the implementation of the controllable oscillator in case of a VCO or a corresponding current signal in case of an ICO.

The inventive device includes a coarse-tuning means 13 and a fine-tuning means 14. The coarse-tuning means is implemented in order to detect a beginning and an end of the second data pattern (synchronization field based on the example of the USB specification). The coarse-tuning means is further implemented in order to count a number of clock periods of the controllable oscillator 10 in a time period from the beginning to the end of the second data pattern. In addition to that, the coarse-tuning means is implemented, in order to control means 11 for oscillator controlling in the case in which the counted number is larger than a reference value, in order to decrease the oscillator clock frequency of the controllable oscillator 10, or to control the controllable oscillator in order to increase its oscillator clock frequency in the case in which the counted number is smaller than the reference value.

The fine-tuning means 14 is implemented analog to this. In contrast to the coarse-tuning means it does not detect the beginning and the end of the second data pattern, however, but the occurrence of a first data pattern in the data stream and a temporally subsequent occurrence of the first data pattern in the data stream.

The fine-tuning means is further implemented in order to count the number of clock periods of the oscillator 10 from an occurrence of the first data pattern up to a next occurrence of the first data pattern in order to then, depending on the position of the counted value with regard to a set reference value, control the oscillator control means 11 so that the oscillation frequency of the controllable oscillator 10 is increased or decreased, respectively. Only in individual lucky cases is the oscillator already tuned correctly due to the coarse tuning.

Thus, an oscillator clock frequency with the relative second accuracy is obtained, i.e. the accuracy underlying the first data pattern that is directly equal to the clock underlying the data stream depending on the specific implementation or equal to a multiple of the clock underlying the data stream or equal to a fraction of the clock underlying the data stream. In particular, integer multiples, like e.g. the two-fold, three-fold, . . . n-fold are preferred, wherein n is an integer number. With regard to the fractions, also integral fractions are preferred, like e.g. ½, ⅓, ¼, . . . , 1/n, wherein n is also an integer number.

Figure 2:
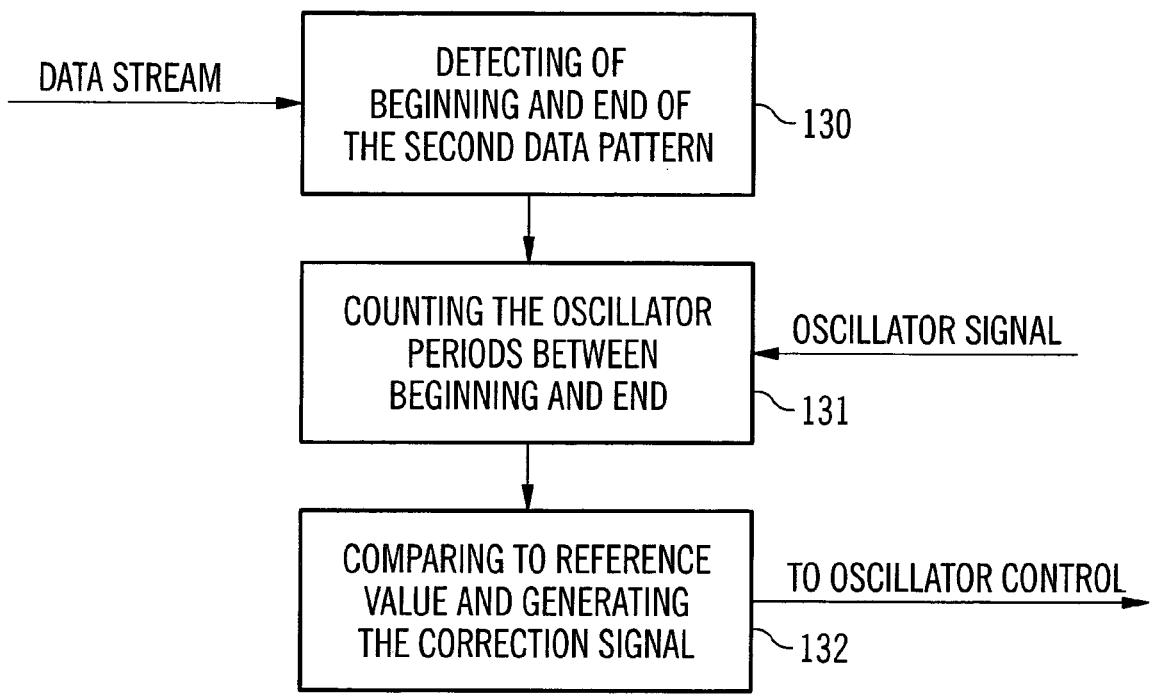
FIG. 2 shows a detailed block diagram of the coarse-tuning means of FIG. 1.

FIG. 2 shows a more detailed block diagram of the coarse-tuning means of FIG. 1. In particular, the coarse-tuning means 13 of FIG. 1 includes means 130 for detecting the beginning and the end of the second data pattern in the data stream, i.e. based on the example of the USB data stream e.g. the beginning of the synchronization pattern in the form of the first electric "1" and the end of the synchronization pattern in the form of the last electric "1" of the synchronization pattern of FIG. 7a. In the implementation, however, also only one part of the synchronization pattern of FIG. 7a may be used as a second data pattern, so that the second data pattern that is used for coarse-tuning purposes begins with the first electric "1" and ends with the seventh logic "0", such that only the alternating part of the synchronization pattern of FIG. 7a is used.

Figure 7A:
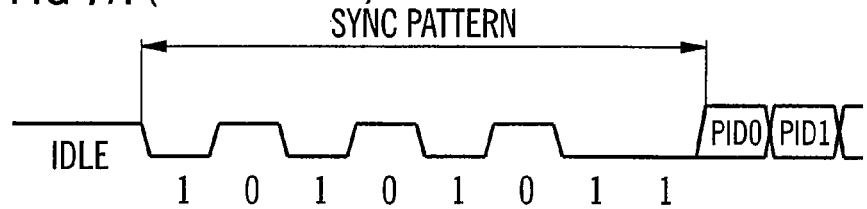
FIG. 7a shows a section of the data stream including the synchronization pattern and a subsequent PID pattern.

Again alternatively, also merely depending on the ratio of the frequency of the controllable oscillator to the bit clock used in FIG. 7a, only one part of the alternating bit pattern may be used.

In response to means 130, means 131 for counting the oscillator periods between the beginning detected by means 130 and the end detected by means 130 is operated. In particular, by a counter activation signal output by means 130, when the same has detected the beginning of the second data pattern, a counter is started counting the clock periods of the oscillator signal fed to means 131 until the end is detected by means 130 or correspondingly until the counter stop signal is transmitted from means 130 to means 131.

The count may then be supplied from means 131 to means 132 which is implemented in order to compare the count to a reference value and in order to provide a corresponding correction signal that is transmitted to the oscillator control (means 11 of FIG. 1). The reference value used by means 132 depends on a nominal frequency of the oscillator 10 and on a temporal duration or on the number of regarded bits, respectively, of the synchronization pattern illustrated in FIG. 7a or of a part of the same. If the bit clock of the synchronization pattern in FIG. 7a is e.g. 12 megabits per second in the full-speed USB mode and if the nominal frequency of the controllable oscillator is for example 96 MHz, i.e. the eight-fold of the full-speed USB clock, and if the overall synchronization field, i.e. the 8 bit clocks for coarse tuning are used, then in this case the predetermined reference value will be 64. This means that in case of an optimum oscillator tuning the controllable oscillator 10 would have to provide 64 clocks during the duration of the synchronization pattern of FIG. 7a. If it provides less than 64 clocks, it is too slow. If it provides more than 64 clocks, however, it is too fast.

Figure 3:
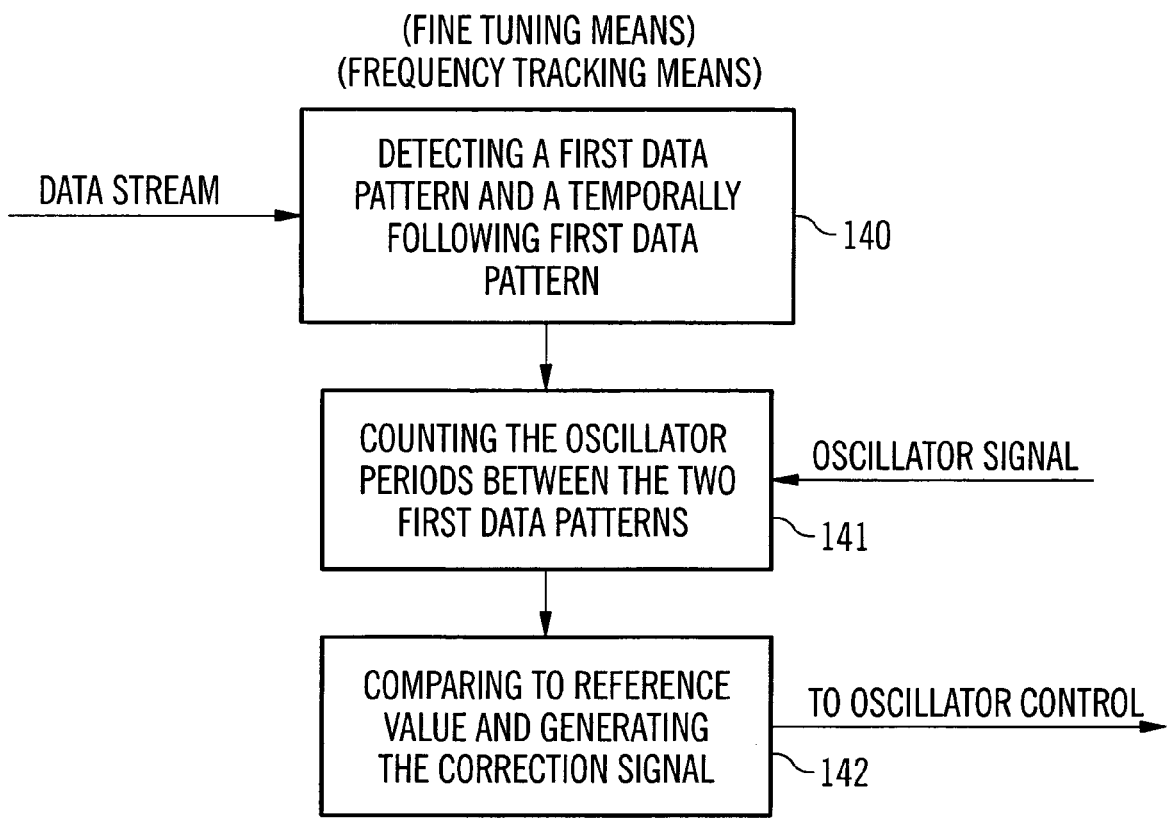
FIG. 3 shows a detailed block diagram of the fine-tuning means of FIG. 3.

FIG. 3 shows a more detailed block diagram of the fine-tuning means 14 of FIG. 1. The fine-tuning means 14 of FIG. 1 includes means 140 for detecting a first data pattern (an SOF-PID based on the example of the USB format) and a temporally subsequent first data pattern. When detecting a first data pattern a counter in means 141 for counting the oscillator periods in a first data pattern is activated which then, when a temporally subsequent first data pattern has been detected, is stopped again. The counter in means 141 is operable in order to count the clock periods of the controllable oscillator 10 of FIG. 1. The count value is then supplied to means 142 which is implemented in order to compare this count value to a reference value and to generate the correction signal supplied to the oscillator control 11 of FIG. 1.

Figure 7B:
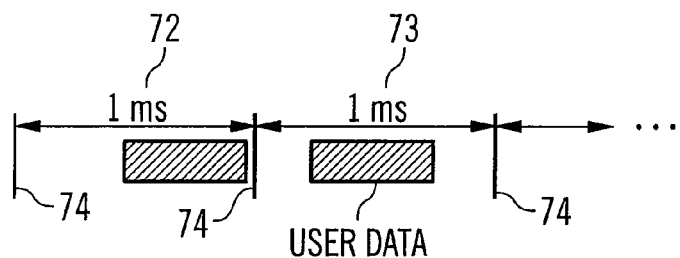
FIG. 7b shows an illustration of the organization of the data stream in frames.
Figure 7C:
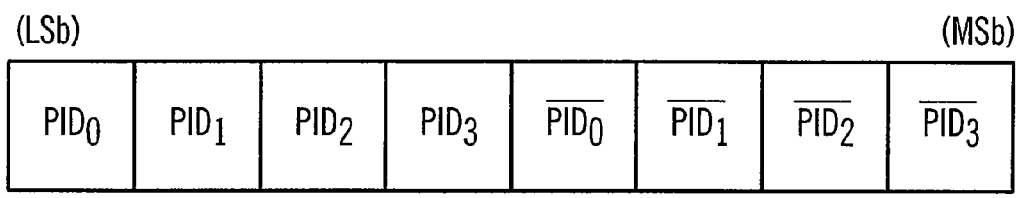
FIG. 7c shows an illustration of the PID contained within the data stream according to the USB standard.
Figure 7D:
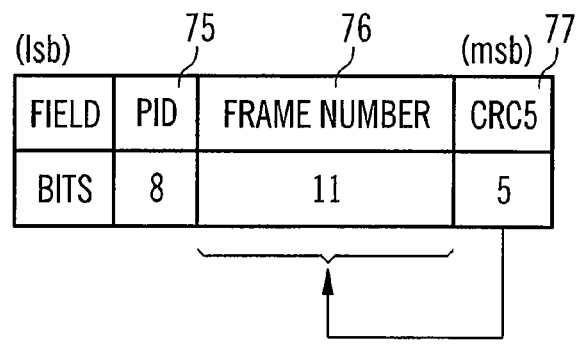
FIG. 7d shows an illustration of the start of frame PID according to the USB standard.

Based on the example of a USB-specified data stream the temporal interval between two subsequent first data patterns is 1 ms, as it is shown in FIG. 7b. If the nominal frequency of the controllable oscillator 10 of FIG. 1 is again 96 MHz, then in this case the predetermined reference value would be 96,000, i.e. 96,000 oscillator cycles would have to occur in the time period of 1 millisecond, so that the oscillator is set correctly. If the count value is larger than 96,000, the oscillator frequency has to be reduced. If the count value is smaller than 96,000, however, the oscillator frequency has to be increased.

The fine-tuning means shown in FIG. 3 may further be used as a frequency-following means after both the coarse tuning and also the fine tuning are completed and the accuracy or the frequency-following capability, respectively, of the oscillator is to be further increased, as it is explained in the following.

Figure 4:
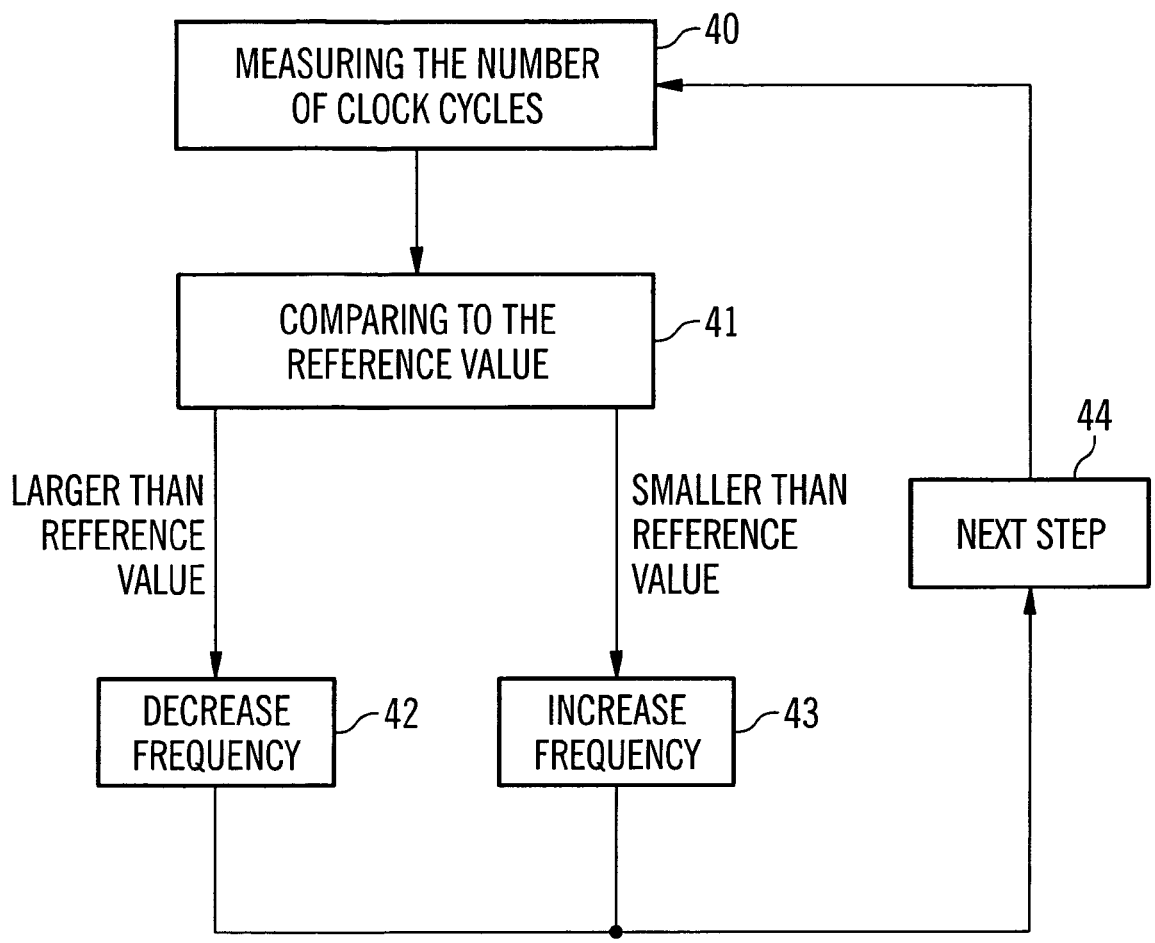
FIG. 4 shows a block diagram of the concept for an iterative coarse or fine tuning, respectively, according to a preferred embodiment of the present invention.

Means 132 of FIG. 2 or 142 of FIG. 3, respectively, are preferably implemented in order to operate iteratively, as it is explained in the following with reference to FIG. 4. The iterative proceeding consists of first measuring the number of clock cycles by means 130 or 140, respectively (40), in order to then compare the measured number to a reference value (41). If the comparison result is such that the number of clock cycles is larger than the reference value, then the frequency is decreased (42). If it is determined, however, that the measured number of clock cycles is smaller than the reference value, then the frequency of the oscillator has to be increased (43). Then an iteration variable is incremented or a next step 44 is entered, respectively, in which it is now checked again whether the frequency increased or decreased in the last step is again too high or too low.

As an iteration strategy or as an increment value, respectively, using which the frequency is increased or decreased, respectively, from one step to the next, different strategies may be used. According to the invention it is preferred to use a concept in which the increment amount, by which the frequency is changed from one step to the next, i.e. id increased or decreased, respectively, changes from step to step and in particular decreases from step to step. For this, it is preferred to use a method of successive approximation which is explained in more detail later with reference to FIG. 6.

In the preferred embodiment of the present invention the 1 ms frame interval for setting the frequency of the free-running oscillator is used. Within 10 frame intervals the frequency accuracy of the oscillator is within the specified range of 0.25%. For this, as it has been implemented, a tuning of the oscillator in two sections is performed, i.e. first in a coarse-tuning section and then in a fine-tuning section.

For coarse tuning the number of oscillator periods between a certain number of SYNC field bits is counted and compared to a reference value. When the counter value is larger than the reference value, the oscillator frequency is too high and is decreased. If, however, the counter value is smaller than the reference value, then the oscillator frequency is too low and is increased. If the number of coarse-tuning steps is equal to C, if the reference value is designated by CR and if the counter value is designated by CC, and if finally the frequency of the oscillator is $v$, then the coarse-tuning algorithm may generally be illustrated as follows:

1. determining $CC_c(v_{c-1})$
2. $CC_c > CR: v_c = v_{c-1} - \Delta v_c$ $CC_c < CR: v_c = v_{c-1} + \Delta v_c$ etc.
3. determining $CC_{c+1}(v_c)$ After a certain small number of coarse-tuning steps the measurement on the basis of SYNC bits may not further improve the accuracy of the oscillator frequency. Now the fine tuning begins.

For fine tuning the number of oscillator periods between SOF packets is counted and an algorithm which is similar to the coarse-tuning algorithm is used. If the fine-tuning step number is F, the reference value is FR and the counter value is FC and the frequency of the oscillator is $v$ again, the fine-tuning algorithm results as follows:

(a) determining $FC_F(v_{F-1})$
(b) $FC_F > FR: v_F = v_{F-1} - \Delta v_F$ $FC_F < FR: v_F = v_{F-1} + \Delta v_F$ etc.
(c) determining $FC_{F+1}(v_F)$ As the time between consecutive SOF packets is accurate to ±500 ns, an accuracy of the set frequency of 0.05% (500 ppm) is achieved.

The frequency of the oscillator after tuning the same is determined by the reference value FR. If the desired oscillator frequency is for example 96 MHz, then the reference value FR has to be 96,000, if consecutive SOF packets are regarded. If not directly consecutive SOF packets are regarded but e.g. two-fold or three-fold consecutive SOF packets, respectively, then the reference value is correspondingly higher. In case of halves, thirds, fourths, ... of the period duration between SOF packets the reference value is correspondingly lower.

As it was already illustrated with reference to FIG. 3, after the fine tuning in a preferred embodiment of the present invention, a frequency-following algorithm takes place further setting the oscillator frequency. Like in the fine-tuning algorithm, the number of oscillator periods between SOF packets present in the data stream is measured.

Figure 8:
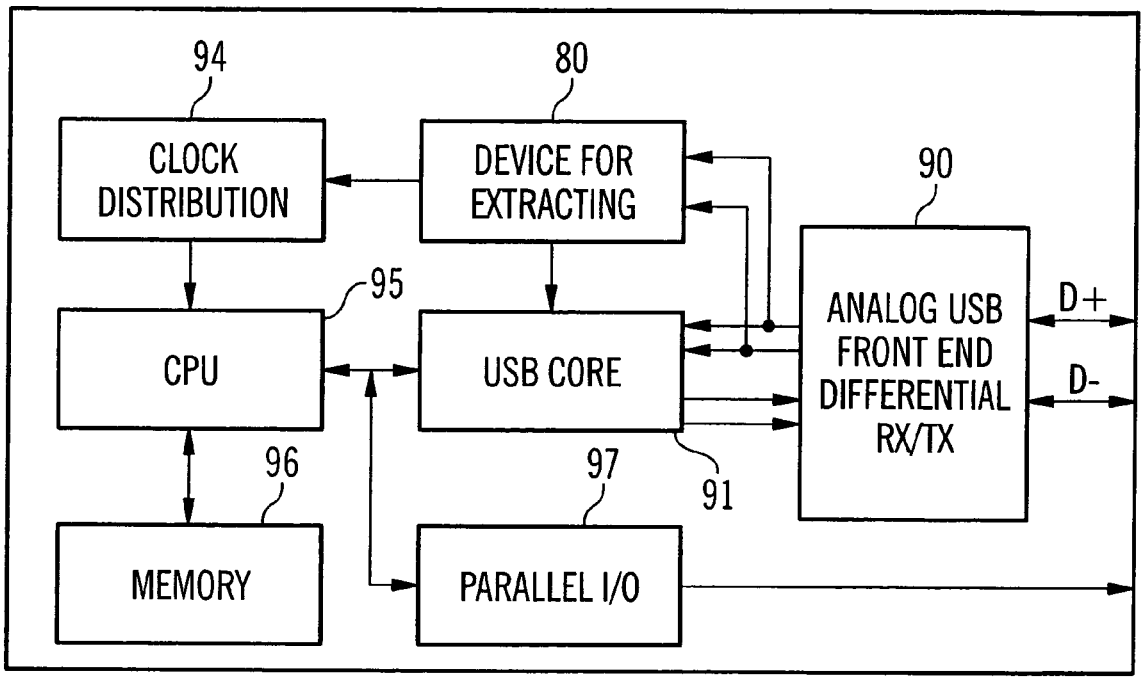
FIG. 8 shows a block diagram of a USB device having an inventive device for extracting.
Figure 9:
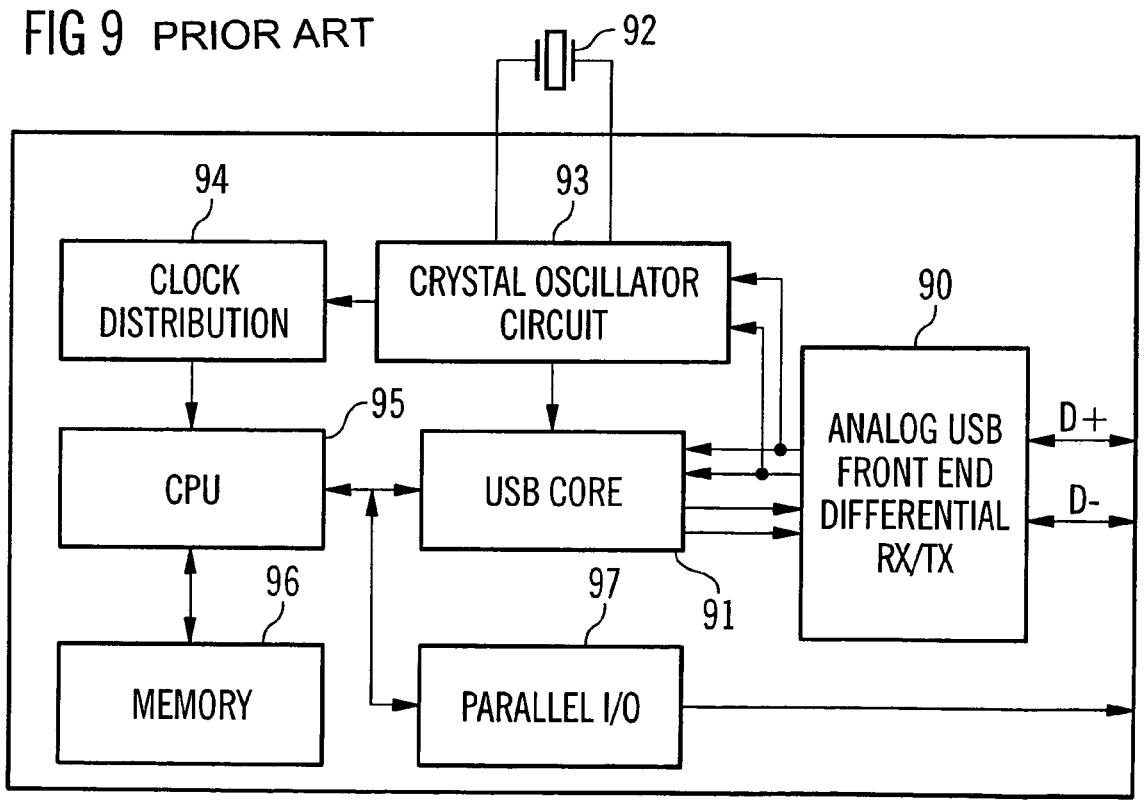
FIG. 9 shows a block diagram of a USB device having an external crystal oscillator.

The oscillator clock obtained after coarse tuning and after fine tuning may for example be used as a reference clock for a USB core. For this, reference is made to FIG. 8, in which the inventive device for extracting is illustrated, designated by 80. The inventive device for extracting therefore has, together with a controllable oscillator, the functionality of blocks 92 and 93 of the known USB functional circuit which was explained with reference to FIG. 9.

It is to be noted that a phase locking between the oscillator clock and the bit clock of the USB data stream is not necessary because the oscillator clock frequency is generally a multiple of the bit clock frequency and an oversampling and digital PLLs may be used for the data recovery.

The inventive device is advantageous in so far that for data streams having an underlying fast clock, like e.g. for full-speed USB data streams and high-speed USB data streams, no crystal oscillator is required. Of course, also for slower-clocked data streams no external oscillators are required.

The inventive device is further advantageous in so far as the regenerated frequency is obtained with a high accuracy determined by the accuracy with which the first data pattern is present in the data stream. Based on the example of the USB application an accuracy of 0.05% is achieved.

In the following, with reference to FIG. 5, a preferred embodiment of the present invention is illustrated schematically. FIG. 5 shows a clock regeneration circuit basically consisting of two main units. One of them is the digitally controllable oscillator 50 comprising on the one hand an oscillator control 11 and on the other hand the controllable oscillator 10 which is a current-controlled oscillator in FIG. 5.

FIG. 5 further shows a digital logic 52 including the coarse-tuning means 13 and the fine-tuning means 14 as it is illustrated in the following.

The current-controlled oscillator 10 is, in the preferred embodiment shown in FIG. 5, a current-controlled ring oscillator with an odd number of chained inverters 51a, 51b, 51c that are supplied with an operating current from a current sum node 57 via which an oscillation frequency of the current-controlled oscillator 10 may be set.

Apart from the current sum node 57 the oscillator control means 11 includes a supply current source or a reference current source 53, respectively, providing a central reference (there is typically additionally an individual bias present), a first digital/analog converter 54, a second digital/analog converter 55 and a third digital/analog converter 56. The digital/analog converters 54, 55, and 56 of FIG. 5 are implemented in order to provide a current on the output side which is a fraction of the supply current supplied on the input side, wherein the selection of the fraction is performed via a binary number supplied to the digital/analog converter via a digital input. Preferably, binarily weighted circuits 54, 55 and 56 are preferred. For example, the DAC 1 (54) provides the value of the supply current 53 at its output to current summation nodes 57 when all bits of the binary number supplied to the same are set. If, however, only the MSB of the DAC 1 (54) is set while all bits having a lower order are equal to 0, then the DAC 1 provides half of the current supplied from the source 53 to the current summation node on the output side. According to the invention, 9-bit-DACs are preferred, although in this implementation also DACs with a higher or lower width, respectively, may be used.

As it may be seen from FIG. 5, the DAC 1 54 is directly supplied from the current supply 53. It may thus provide the maximum current amount on the output side. The DAC 1, in a preferred embodiment of the present invention, is set by coarse tuning and fine tuning. In particular, the higher-order bits of the DAC 1 are set by coarse tuning while the lower-order bits of the DAC 1 are set by fine tuning. The DAC 2 55 is used for a frequency tracking. Its supply current and thus the oscillator control current that may at maximum be provided from the same to the current summation node 57 is controllable by the DAC 3 56. If the DAC 3 56 is controlled by a binary value in which all bits are set, then the output current of the DAC 3 56 is equal to the supply current 53 which directly causes that the DAC 2, when it is also pulsed with ones only, may supply the same current to the summation node 57. According to the invention it is preferred, however, to pulse the DAC 3 with a binary number that is smaller than the binary number that may at maximum be pulsed, in order to reduce the maximum current that is supplied by the DAC 2 55 to the current summation node 57. This reduced maximum current may then, due to the fact that the DAC 2 55 may also be pulsed for example with 9 bits, be divided finer in order to be able to perform a frequency tracking for which the DAC 2 55 is used with a finer accuracy as it is determined by the LSB of the DAC 1. Generally speaking, the granularity of the current output by the DAC 2 is inversely proportional to the operational current supplied to the DAC 2. The smaller the operational current supplied to the DAC 2 (set by the DAC 3) the finer the granularity in the frequency-tracking mode following after the fine-tuning mode.

The digitally controllable oscillator 11 thus includes a supply source 53, the current-controlled ring oscillator 10 and the three DACs 54, 55 and 56. The DACs that are controlled by the digital logic 52 provide the control current for the frequency setting of the current-controlled oscillator ICO 10. The overall current for the ICO is the sum of the currents that are supplied from the two DACs 54 and 55. The areas of the digital/analog converters 1 and 2 are preferably overlapping. It is preferred that the maximum output current of the DAC 1 be a programmable multiple (programmable by the DAC 3) of the maximum output of the DAC 2. Preferably, a factor 4 is used.

At this point it is further noted that during the coarse-tuning mode and the fine-tuning mode the DAC 3 56 is pulsed such that the supply current in the DAC 2 is smaller by the programmable multiple than the supply current in the DAC 1. In addition, it is preferred, that during coarse tuning and fine tuning the MSB of the DAC2 is set and/or all other bits of the DAC 2 are not set. The DAC 2 thus provides half of the overall possible maximum output current to the current summation node 57. If then all bits of the DAC have been set by the coarse-tuning mode and the fine-tuning mode, then by an additional setting of bits of the DAC 2 having a lower order than the MSB of the same, the current may be increased. If the current in the fine-tuning mode is to be reduced, however, then the MSB of the DAC 2 is reset and as required the bits of a lower order are set or not set. By the fact that during the coarse-tuning mode and the fine-tuning mode the MSB of the DAC 2 is set, it is guaranteed that in the frequency-tracking mode following after the fine-tuning mode the supply current for the current-controller oscillator may both be increased and decreased.

The digital logic 52 in FIG. 5 includes the following basic functional blocks. First of all, the circuit includes a synchronization field detector 520 also designated by SD in FIG. 5. The digital logic further includes a data recovery block 521, a start of frame packet identification detector (SOF-PID detector) 522, an oscillator clock cycle counter 523, a digital oscillator control logic 524 also referred to as correction value generation means in FIG. 5, and further a block 525 designated as clock advancing logic and clock divider/multiplier.

The synchronization field detector 520 includes an SE0 detector, a synchronization detector, a state machine and its own counter. The block 520 is connected to the differential signals Dp and Dm of the USB bus. The block 520 is operable in order to intercept signals on the bus and to thus monitor the bus traffic in order to, using the SE0 detector, detect certain bus conditions, like e.g. the presence of "single ended zero". In the SE0 mode both Dp and also Dm are on the same state, like e.g. high. As Dp and Dm are actually differential signals per definition, the SE0 state is actually a forbidden state which contains no expressive useful data. According to the USB specification, a state SE0 is used only, however, when the end of a packet has been achieved. The SE0 detector thus detects the end of a preceding packet and thus also the beginning of a synchronization field which the synchronization detector then detects in response to the SE0 detector. After an SE0 condition has been detected in block 520, the state machine is activated in block 520 in order to wait for the reception of a synchronization pattern, as it is illustrated in FIG. 7a. The counter in block 520 measures the length of the synchronization pattern by counting the number of oscillator periods between the beginning and the end of the synchronization field.

The data recovery block 521 is enabled by block 520 via the line designated by EN after the block 520 received a valid synchronization pattern. The data recovery unit 521 is then disabled again when the block 520 receives a state SE0. In addition to that, the measurement result of block 520 is fed to block 521 with regard to the length of the synchronization field which then uses this information in order to extract "zeros" and "ones" from the serial USB data stream, i.e. to decode the data stream or to recover information contained within the data stream, respectively. Always when a valid "0" or a valid "1" has been detected by block 521, the same is signalized at the output of block 521 such that block 521 provides a sequence of zeros and ones, respectively.

The start of frame packet identification detector 521 also referred to as SOF token detector examines the serial data stream of block 521 and signalizes the counter 523 when it has detected a start of frame packet identification number (SOF-PID).

The oscillator clock cycle counter 523 counts the number of DCO periods between the reception of consecutive SOF tokens. In addition, the counter 523 includes a plausibility examination means which examines whether SOF tokens were missed. The plausibility examination means is implemented in order to compare a coarse count value to a current count value. If the current count value exceeds the coarse count value by a very high amount, this indicates that at least one SOF-PID between the two SOF-PIDs was missed. In this case, the counter 523 is controlled in so far that this count value is not made available for means 522, as this would lead to a severe wrong setting of the controllable oscillator. Instead, this count value is marked as not plausible and is discarded.

The correction value generation means 524 then performs the frequency tuning and the frequency tracking. After a reset the frequency-tuning algorithm is active. First of all, the frequency of the oscillator is coarsely tuned. For a coarse tuning the cycle number of the synchronization pattern is used which was measured by block 520. The coarse tuning determines the most significant bits of the DAC 1, as it has been discussed.

With every tuning step the low-order bits are gradually determined. After a certain number C of coarse-tuning steps, wherein with a bit width of the DAC 1 of 9 three steps are preferred for the coarse tuning, the fine-tuning algorithm starts, activated by a control means illustrated in FIG. 1 which controls the step sequence of coarse tuning, fine tuning and frequency tracking in principle.

If the width of the DAC 1 is D1 bits, the number of fine-tuning steps is D1−C.

As it has been explained, after fine tuning frequency tracking takes place. Like with the fine-tuning algorithm, also with frequency tracking the cycle count value of counter 521 is used in order to further set the oscillator frequency via the DAC 2 55.

In the following, reference is made to FIG. 6 in order to illustrate the functionality of the correction value generation means 524 in more detail.

In a first step 60 the most significant bit of the DAC 1 is set to 1 while the remaining bits are set to 0. The MSB of the DAC 2 is then also set during the whole coarse and fine tuning while the remaining bits of the DAC 2 are equal to 0. In a step 61 means 524 performs a frequency comparison using the input values of block SD 520 for coarse tuning or of the counter 523 for fine tuning. If the frequency is too high, the MSB of the DAC 1 is set to 0. If the frequency is too low, however, the MSB of the DAC 1 remains at 1. Then, means 524 is operable in order to set the MSB-1 of the DAC 1 to 1 in a step 62 after the MSB is such as it was determined in step 61.

In a step 63 means 524 is operable again in order to perform a frequency comparison. If the frequency is too high, then the bit MSB-1 of the DAC 1 is reset to 0. If the frequency is too low, however, the bit MSB-1 of the DAC 1 remains at its set value, i.e. at 1. This manner of the successive iterative approximation is continued until a corresponding predetermined number of bits of the DAC 1 is set. Then, by the control 15 of FIG. 1, the correction value generation means 524 is activated in order to go from the coarse-tuning mode into the fine-tuning mode and to now operate not based on the count values of block 520 but based on the count values of block 523 in order to gradually calculate the remaining bits of the DAC 1 in the fine-tuning mode.

When finally all bits of the DAC 1 have been calculated (64), a switch into the frequency-tracking mode (65) is performed in which the bits of the DAC 2 are correspondingly set. If it is determined in the last step 64 of the fine-tuning mode that the frequency was too low, this indicates that the MSB of the DAC 2 which was set to 1 at the beginning in step 60 is rightly at 1. If, however, it is determined in the last step 64 of the fine-tuning mode that the frequency is too high, the MSB of the DAC 2 is set to 0 and the successive approximation with the MSB-1 of the DAC 2 is performed gradually. Depending on the implementation, the DAC 3 may be reprogrammed at certain points of time in order to set the maximum output current and thus the granularity of the DAC 2 or to adjust to changing conditions, respectively.

Depending on the conditions, the inventive method for extracting a clock frequency underlying a data stream may be implemented in hardware or in software. The implementation may be performed on a digital storage medium, in particular on a floppy disc or a CD with electronically readable control signals which may cooperate with a programmable computer system so that the corresponding method is implemented. Generally, the invention thus also consists in a computer program product with a program code stored on a machine-readable carrier for performing the inventive method when the computer program product runs on a computer. In other words, the invention may thus be realized as a computer program with a program code for performing the method when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for extracting a clock frequency underlying a data stream, wherein the data stream comprises a first data pattern at regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy smaller than the first relative accuracy, comprising:

controller for controlling a controllable oscillator for providing an oscillator clock with an oscillator clock frequency, wherein the controller for controlling comprises both a first digital/analog converter and a second digital/analog converter and a summer, coupled to the outputs of the first digital/analog converter and the second digital/analog converter and implemented in order to provide a control signal for the controllable oscillator;

a coarse-tuner implemented in order to control the controller for controlling the oscillator using the second data pattern and a number of clock periods of the oscillator in order to reduce the oscillator clock frequency of the controllable oscillator or to increase the oscillator clock frequency;

a fine-tuner operable after the coarse-tuner was operable and implemented in order to control the controller for controlling the oscillator using the first data pattern and a temporally subsequent first data pattern and a number of clock periods of the oscillator between the first data pattern and the temporally subsequent first data pattern in order to reduce the oscillator clock frequency of the controllable oscillator or to increase the oscillator clock frequency of the controllable oscillator, whereby the oscillator clock frequency is obtained with the relative second accuracy which is equal to the clock frequency underlying the data stream or equal to a multiple or a fraction of the clock frequency underlying the data stream, wherein the coarse-tuner and the fine-tuner are operable in order to set bits of the first digital/analog converter; and a frequency-tracker which is implemented in order to be operable after a coarse tuning by the coarse-tuner and after a fine tuning by the fine-tuner in order to set bits of the second digital/analog converter.

2. The device according to claim 1, wherein the coarse-tuner is implemented to detect a beginning and an end of the second data pattern, to count a number of clock periods of the oscillator in a time duration from the beginning to the end of the second data pattern, and in a case in which the counted number is larger than a reference value, to control the controller for controlling the oscillator in order to reduce the oscillator clock frequency of the controllable oscillator, or in a case in which the counted number is smaller than the reference value, to control the controller for controlling the oscillator in order to increase the oscillator clock frequency.

3. The device according to claim 1, wherein fine-tuner is implemented
to detect the first data pattern and the temporally subsequent first data pattern,
to count the number of clock periods of the oscillator between the first data pattern and the temporally subsequent first data pattern, and
in a case in which the counted number is larger than a reference value, to control the controller for controlling the oscillator in order to reduce the oscillator clock frequency of the controllable oscillator, or in a case in which the counted number is smaller than the reference value, to control the controller for controlling the oscillator in order to increase the oscillator clock frequency of the controllable oscillator.

4. The device according to claim 1,
wherein the data stream is divided into frames, wherein each frame comprises a plurality of packets, wherein a first packet in each frame comprises a start of frame identification and wherein each packet comprises a synchronization field wherein the start of frame identification is used as the first data pattern and wherein the synchronization field is used as the second data pattern.

5. The device according to claim 1,
wherein the second data pattern comprises at least two consecutive zero-one bit sequences.

6. The device according to claim 1,
wherein the coarse-tuner is implemented to detect a signal pattern in the data stream carrying no useful information which is different from all possible data patterns carrying useful information and which directly precedes the second data pattern in the data stream, wherein the coarse-tuner is further implemented to interpret, in a detection of the signal pattern, a signal change following the signal pattern as the beginning of the second data pattern.

7. The device according to claim 1,
wherein the second data pattern comprises a pre-known edge sequence, wherein the coarse-tuner is implemented in order to track edge changes after a beginning of the second data pattern in order to detect the end of the second data pattern when a predetermined number of edge changes has passed.

8. The device according to claim 6, wherein the data stream is present as a differential signal with a positive sub-signal and a negative sub-signal, wherein the signal pattern is implemented such that both sub-signals have the same value.

9. The device according to claim 1, wherein the fine-tuner further comprises:
a data recovery circuit implemented to be activated by the coarse-tuner at an end of the second data pattern in order to extract data following the second data pattern from the data stream.

10. The device according to claim 9, wherein the fine-tuner further comprises:
a data examiner for examining the data extracted from the data recovery circuit in order to detect a first data pattern when examined data are equal to a predetermined data pattern.

11. The device according to claim 10, wherein the predetermined data pattern is a special predefined bit sequence.

12. The device according to claim 11, wherein the special predetermined bit sequence is a start of frame packet identification number.

13. The device according to claim 1,
wherein the fine-tuner comprises a counter which is started depending on detection of the first data pattern and stopped depending on detection of the temporally subsequent first data pattern.

14. The device according to claim 1, wherein the fine-tuner comprises a plausibility examiner which is implemented in order to examine a counted number of clock periods of the oscillator as to whether the value is smaller than an upper threshold and thus plausible, wherein in case of a determined non-plausibility the obtained count value is not used for a fine tuning.

15. The device according to claim 1, wherein the controllable oscillator is integrated on a chip together with the coarse-tuner and the fine-tuner.

16. The device according to claim 1,
wherein the controllable oscillator comprises an odd number of inverters connected in a ring.

17. The device according to claim 1, wherein the controllable oscillator is current-controlled.

18. The device according to claim 1,
wherein the coarse-tuner is implemented in order to operate iteratively and is further implemented in order to detect again a beginning and an end of the second data pattern, to count the number of clock periods, and to control the oscillator in an iteration step after a frequency decrease or a frequency increase.

19. The device according to claim 18, wherein the coarse-tuner is implemented in order to control the controllable oscillator in a first iteration step so that the frequency of the controllable oscillator changes by a first predetermined differential frequency and in order to control the controllable oscillator in a further iteration step so that the frequency changes by a second predetermined differential frequency, wherein the second predetermined differential frequency is smaller than the first predetermined differential frequency.

20. The device according to claim 1, wherein the fine-tuner is implemented in order to operate iteratively and is further implemented in order to detect again a beginning and an end of the first data pattern, to count the number of clock periods, and to control the oscillator in a further iteration step after the frequency decrease or the frequency increase.

21. The device according to claim 1, wherein the fine-tuner is implemented in order to control the controllable oscillator in a first iteration step so that the frequency of the controllable oscillator changes by a first predetermined differential frequency, and in order to control the controllable oscillator in a further iteration step so that the frequency of the controllable oscillator changes by a second predetermined differential frequency, wherein the second predetermined differential frequency is smaller than the first predetermined differential frequency.

22. The device according to claim 18, wherein the differential frequency is binarily weighted and is always half the size of a preceding differential frequency.

23. The device according to claim 1, wherein the first digital/analog converter is supplied on the input side with a binary number of a width of n bits and is be supplied with an electric input quantity, and
wherein a magnitude of an output signal of the first digital/analog converter is equal to a ratio determined by the binary number and the electric input quantity.

24. The device according to claim 23, wherein the coarse-tuner is implemented in order to determine a predetermined number of low-order bits of the first digital/analog converter following the most significant bit in an iterative way and based on the most significant bit, wherein the predetermined number is smaller than n.

25. The device according to claim 24, wherein the fine-tuner is implemented in order to determine, iteratively and based on a bit, whose order is smaller than a least significant bit determined by the coarse-tuning means, remaining bits of the first digital/analog converter.

26. The device according to claim 23,
wherein the second digital/analog converter is be supplied with an electric input quantity smaller than the electric input quantity the first digital/analog converter is supplied with,
wherein a most significant bit of the second digital/analog converter is set during the determination of bits of the first digital/analog converter by the coarse-tuner and the fine-tuner.

27. The device according to claim 26, wherein the oscillator control comprises a third digital/analog converter which is implemented in order to provide the electric input quantity for the second digital/analog converter, wherein the third digital/analog converter is supplied with the same electric input quantity with which the first digital/analog converter is supplied, and wherein the third digital/analog converter is supplied with a binary number on the input side which causes the electric input quantity for the second digital/analog converter to be smaller than the electric input quantity for the first digital/analog converter.

28. The device according to claim 27,
wherein the oscillator controller further comprises its own supply source for supplying the electric input quantity for the first digital/analog converter and the third digital/analog converter.

29. The device according to claim 23, wherein the electric input quantity is a current and the electric output quantity is a current.

30. The device according to claim 1,
wherein the data stream is a data stream according to the USB standard in which clock frequencies of 1.5 MHz, 12 MHz and 480 MHz is used.

31. The device according to claim 30, wherein the oscillator clock frequency is controllable to a nominal frequency of 96 MHz, so that the oscillator clock frequency is the 64-fold of 1.5 MHz, the 8-fold of 12 MHz or the ⅕-fold of 480 MHz, so that the same nominal oscillator clock frequency is used for all USB frequencies.

32. A method for extracting a clock frequency underlying a data stream, wherein the data stream comprises a first data pattern, in regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy which is smaller than the first relative accuracy, comprising:
controlling a controllable oscillator for providing an oscillator clock with an oscillator clock frequency using a coarse-tuning step, a fine-tuning step and a frequency-tracking step, wherein controlling is performed by means of a first digital/analog converter and a second digital/analog converter and a summer coupled to the outputs of the first digital/analog converter and the second digital/analog converter and is implemented to provide a control signal for the controllable oscillator,
wherein in the coarse-tuning step using the second data pattern and a number of clock periods of the oscillator the oscillator clock frequency is decreased or increased; and
wherein in the fine-tuning step following the coarse-tuning step using a first data pattern and a temporally subsequent first data pattern and a number of clock periods of the oscillator between the first data pattern and the temporally subsequent first data pattern the oscillator clock frequency is decreased or increased,
whereby the oscillator clock frequency with the relative second accuracy is obtained which is equal to the clock frequency underlying the data stream or to a multiple or a fraction of the clock frequency underlying the data stream,
wherein by the coarse-tuning step and the fine-tuning step bits of the first digital/analog converter are set, and
wherein the frequency-tracking step is performed after the coarse-tuning step and after the fine-tuning step, and wherein in the frequency-tracking step bits of the second digital/analog converter are set.

33. A device for extracting a clock frequency underlying a data stream, wherein the data stream comprises a first data pattern in regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy smaller than the first relative accuracy, comprising:
a controller for controlling a controllable oscillator for providing an oscillator clock with an oscillator clock frequency;
a coarse-tuner implemented
to control the controller for controlling the controllable oscillator in order to decrease the oscillator clock frequency of the controllable oscillator or in order to increase the oscillator clock frequency, using the second data pattern and a number of clock periods of the oscillator; and
a fine-tuner which is operable after the coarse-tuner was operable and which is implemented
to control the controller for controlling the controllable oscillator in order to decrease the oscillator clock frequency of the controllable oscillator or to increase the oscillator clock frequency of the controllable oscillator, using a first data pattern and a temporally subsequent first data pattern and a number of clock periods of the oscillator between the first data pattern and the temporally subsequent first data pattern,
whereby the oscillator clock frequency with the relative second accuracy is obtained equal to the clock frequency underlying the data stream or equal to a multiple or a fraction of the clock frequency underlying the data stream,
wherein the oscillator control comprises a digital/analog converter,
wherein the digital/analog converter is supplied with a binary number of a width of n bits on the input side, wherein a control quantity supplied by the digital/analog converter on the output side is supplied to the controllable oscillator,
wherein the coarse-tuner is implemented in order to determine, iteratively and based on a most significant bit, a predetermined number of low-order bits following the most significant bit, wherein the predetermined number is smaller than n, and wherein the fine-tuner is implemented in order to determine, iteratively and based on a bit whose order is smaller than a least significant bit determined by the coarse-tuning means, remaining bits of the digital/analog converter.

34. A method for extracting a clock frequency underlying a data stream, wherein the data stream comprises a first data pattern, in regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy which is smaller than the first relative accuracy, comprising:

controlling a controllable oscillator for providing an oscillator clock with an oscillator clock frequency using a coarse-tuning step and a fine-tuning step, wherein the coarse-tuning step is implemented to decrease or increase the oscillator clock frequency using the second data pattern and a number of clock periods of the oscillator; and wherein the fine-tuning step following the coarse-tuning step is implemented in order to decrease or increase the oscillator clock frequency using a first data pattern and a temporally subsequent first data pattern and a number of clock periods of the oscillator between the first data pattern and the temporally subsequent first data pattern, whereby the oscillator clock frequency with the relative second accuracy is obtained which is equal to the clock frequency underlying the data stream or equal to a multiple or to a fraction of the clock frequency underlying the data stream, wherein for an oscillator control a digital/analog converter is present, wherein the digital/analog converter is supplied on the input side with a binary number of a width of n bits, wherein a control quantity provided by the digital/analog converter on the output side is supplied to the controllable oscillator, wherein in the coarse-tuning step, iteratively and based on a most significant bit, a predetermined number of low-order bits following the most significant bits is determined, wherein the predetermined number is smaller than n, and wherein in the fine-tuning step, iteratively and based on a bit whose order is smaller than a least significant bit determined by the coarse-tuning means, remaining bits of the digital/analog converter are determined.

35. A computer program stored on a computer readable medium for performing a method for extracting a clock frequency underlying a data stream, wherein the data stream comprises a first data pattern, in regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy which is smaller than the first relative accuracy, comprising:

controlling a controllable oscillator for providing an oscillator clock with an oscillator clock frequency using a coarse-tuning step, a fine-tuning step and a frequency-tracking step, wherein controlling is performed by means of a first digital/analog converter and a second digital/analog converter and a summer coupled to the outputs of the first digital/analog converter and the second digital/analog converter and is implemented to provide a control signal for the controllable oscillator, wherein in the coarse-tuning step using the second data pattern and a number of clock periods of the oscillator the oscillator clock frequency is decreased or increased; and wherein in the fine-tuning step following the coarse-tuning step using a first data pattern and a temporally subsequent first data pattern and a number of clock periods of the oscillator between the first data pattern and the temporally subsequent first data pattern the oscillator clock frequency is decreased or increased, whereby the oscillator clock frequency with the relative second accuracy is obtained which is equal to the clock frequency underlying the data stream or to a multiple or a fraction of the clock frequency underlying the data stream, wherein by the coarse-tuning step and the fine-tuning step bits of the first digital/analog converter are set, and wherein the frequency-tracking step is performed after the coarse-tuning step and after the fine-tuning step, and wherein in the frequency-tracking step bits of the second digital/analog converter are set when the computer program runs on a computer.

36. A computer program comprising stored on a computer readable medium for performing a method for extracting a clock frequency underlying a data stream, wherein the data stream comprises a first data pattern, in regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy which is smaller than the first relative accuracy, comprising:

controlling a controllable oscillator for providing an oscillator clock with an oscillator clock frequency using a coarse-tuning step and a fine-tuning step, wherein the coarse-tuning step is implemented to decrease or increase the oscillator clock frequency using the second data pattern and a number of clock periods of the oscillator; and wherein the fine-tuning step following the coarse-tuning step is implemented in order to decrease or increase the oscillator clock frequency using a first data pattern and a temporally subsequent first data pattern and a number of clock periods of the oscillator between the first data pattern and the temporally subsequent first data pattern, whereby the oscillator clock frequency with the relative second accuracy is obtained which is equal to the clock frequency underlying the data stream or equal to a multiple or to a fraction of the clock frequency underlying the data stream, wherein for an oscillator control a digital/analog converter is present, wherein the digital/analog converter is supplied on the input side with a binary number of a width of n bits, wherein a control quantity provided by the digital/analog converter on the output side is supplied to the controllable oscillator, wherein in the coarse-tuning step, iteratively and based on a most significant bit, a predetermined number of low-order bits following the most significant bits is determined, wherein the predetermined number is smaller than n, and wherein in the fine-tuning step, iteratively and based on a bit whose order is smaller than a least significant bit determined by the coarse-tuning means, remaining bits of the digital/analog converter are determined, when the computer program runs on a computer.

37. A device for extracting a clock frequency underlying a data stream, wherein the data stream comprises a first data pattern at regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy smaller than the first relative accuracy, comprising:

control means for controlling a controllable oscillating means for providing an oscillator clock with an oscillator clock frequency, wherein the control means for controlling comprises both a first digital/analog converting means and a second digital/analog converting means and a summer, coupled to the outputs of the first digital/analog converting means and the second digital/analog converting means and implemented in order to provide a control signal for the controllable oscillating means;

a coarse tuning means implemented in order to control the control means for controlling the oscillating means using the second data pattern and a number of clock periods of the oscillating means in order to reduce the oscillator clock frequency of the controllable oscillator or to increase the oscillator clock frequency;

a fine tuning means operable after the coarse tuning means was operable and implemented in order to control the control means for controlling the oscillating means using the first data pattern and a temporally subsequent first data pattern and a number of clock periods of the oscillating means between the first data pattern and the temporally subsequent first data pattern in order to reduce the oscillating means clock frequency of the controllable oscillating means or to increase the oscillating means clock frequency of the controllable oscillating means, whereby the clock frequency of the controllable oscillating means is obtained with the relative second accuracy which is equal to the clock frequency underlying the data stream or equal to a multiple or a fraction of the clock frequency underlying the data stream, wherein the coarse tuning means and the fine tuning means are operable in order to set bits of the first digital/analog converting means; and a frequency-tracking means which is implemented in order to be operable after a coarse tuning by the coarse tuning means and after a fine tuning by the fine-tuning means in order to set bits of the second digital/analog converting means.

38. The device according to claim 37, wherein the fine tuning means further comprises:

a data recovery circuit means implemented to be activated by the coarse tuning means at an end of the second data pattern in order to extract data following the second data pattern from the data stream.

39. The device according to claim 37, wherein the fine tuning means further comprises:

a data examining means for examining the data extracted from the data recovery circuit in order to detect a first data pattern when examined data are equal to a predetermined data pattern.

40. The device according to claim 37, wherein the fine tuning means comprises a counting means which is started depending on detection of the first data pattern and stopped depending on detection of the temporally subsequent first data pattern.

41. The device according to claim 37, wherein the fine tuning means comprises a plausibility examining means which is implemented in order to examine a counted number of clock periods of the oscillating means as to whether the value is smaller than an upper threshold and thus plausible, wherein in case of a determined non-plausibility the obtained count value is not used for a fine tuning.

42. A device for extracting a clock frequency underlying a data stream, wherein the data stream comprises a first data pattern in regular first temporal intervals specified with a relative first accuracy, and wherein the data stream further comprises a second data pattern comprising a plurality of clock periods with the clock frequency or a multiple of the clock frequency, wherein the clock periods are specified with a second relative accuracy smaller than the first relative accuracy, comprising:

a control means for controlling a controllable oscillating means for providing an oscillator clock with an oscillator clock frequency;

a coarse tuning means implemented
  to control the control means for controlling the controllable oscillating means in order to decrease the oscillator clock frequency of the controllable oscillator or in order to increase the oscillator clock frequency, using the second data pattern and a number of clock periods of the oscillating means; and a fine tuning means which is operable after the coarse tuning means was operable and which is implemented
  to control the control means for controlling the controllable oscillating means in order to decrease the oscillator clock frequency of the controllable oscillator or to increase the oscillator clock frequency of the controllable oscillator, using a first data pattern and a temporally subsequent first data pattern and a number of clock periods of the oscillating means between the first data pattern and the temporally subsequent first data pattern, whereby the oscillator clock frequency with the relative second accuracy is obtained equal to the clock frequency underlying the data stream or equal to a multiple or a fraction of the clock frequency underlying the data stream, wherein the controllable oscillating means comprises a digital/analog converting means, wherein the digital/analog converting means is supplied with a binary number of a width of n bits on the input side, wherein a control quantity supplied by the digital/analog converting means on the output side is supplied to the controllable oscillating means, wherein the coarse tuning means is implemented in order to determine, iteratively and based on a most significant bit, a predetermined number of low-order bits following the most significant bit, wherein the predetermined number is smaller than n, and wherein the fine tuning means is implemented in order to determine, iteratively and based on a bit whose order is smaller than a least significant bit determined by the coarse-tuning means, remaining bits of the digital/analog converting means.

* * * * *